US006252451B1

(12) United States Patent
Guitton et al.

(10) Patent No.: US 6,252,451 B1
(45) Date of Patent: Jun. 26, 2001

(54) SWITCHING CIRCUIT

(75) Inventors: Fabrice Guitton, Tours; Didier Magnon, Saint Georges les Baillargeaux; Jean-Michel Simonnet, Veretz; Olivier Ladiray, Montlouis sur Loire, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/375,858

(22) Filed: Aug. 17, 1999

(30) Foreign Application Priority Data

Aug. 28, 1998 (FR) .................................................. 98 10929

(51) Int. Cl.[7] .................................................. H03K 17/72
(52) U.S. Cl. .............................................................. 327/440
(58) Field of Search .................................... 327/438–441, 327/445, 451, 453, 454, 459–463, 468, 474, 475

(56) References Cited

U.S. PATENT DOCUMENTS

| 3,660,688 | * | 5/1972 | Evans et al. ......................... 327/428 |
| 3,665,212 | * | 5/1972 | Roberts et al. ...................... 327/451 |
| 3,899,713 | | 8/1975 | Barkan et al. ........................ 315/34 |
| 4,489,340 | | 12/1984 | Ueda et al. ............................ 357/38 |
| 4,558,683 | * | 12/1985 | Okuda ................................. 123/599 |
| 4,675,776 | * | 6/1987 | Howell ................................. 361/92 |
| 5,861,721 | | 1/1999 | Johnson .............................. 315/291 |

OTHER PUBLICATIONS

French Search Report from French Patent Application 98 10929, filed Aug. 28, 1998.

Tsay C., et al., "A High Power Circuit Model For The Gate Turn Off Thyristor" Proceedings Of The Annual Power Electronics Specialists Conference (PESC), San Antonio, Jun. 11–14, 1990, vol. 1, no. Conf. 21, Jun. 11, 1990, pp 390–397, Institute Of Electrical and Electronics Engineers.

* cited by examiner

Primary Examiner—Toan Tran
(74) Attorney, Agent, or Firm—Wolf, Greenfield & Sacks, P.C.; James H. Morris; Theodore E. Galanthay

(57) ABSTRACT

A one-way switching circuit of the type including a gate tun-off thyristor biased to be normally on, further includes, between the gate and a supply line, a capacitor and a controllable switch connected in parallel.

26 Claims, 2 Drawing Sheets

SWITCHING CIRCUIT

BACKGROUND OF THE INVENTION

1. Field of the Invention

The present invention generally relates to the field of switches, and more specifically to the making of switches adapted to switching a circuit connected to the mains in a way compatible with present standards relative to electromagnetic disturbances.

2. Discussion of the Related Art

To switch a high mains voltage, thyristor-type switches which are normally off (which have to be controlled to be turned on) or assemblies which are normally on (which have to be controlled to be turned off) are currently used. The turn-on or turn-off control of these switches creates a strong current variation during a very short time interval. This abrupt variation is likely to cause electromagnetic disturbances in neighboring equipment.

FIG. 1 illustrates an example of normally-on switch assembly. It is desired herein to control the supply of a load 1 intended for receiving part of the power that an A.C. supply voltage source Vac, for example the mains voltage, applied between two terminals 2, 3, can provide. The power provided to load 1 is controlled by a switching circuit 4. Circuit 4 includes a switch 5 and a control circuit 6. Switch 5 is a gate turn-off thyristor (GTO), provided with anode and cathode gates which are interconnected by a resistor R1.

FIG. 2 shows the shape of current I in the load as a function of time. Due to the presence of resistor R1, the GTO thyristor naturally turns on at the beginning of each positive halfwave of voltage Vac (times t1). Circuit 6 is meant to turn off the GTO thyristor when supply voltage Vac reaches a predetermined level. In the illustrated example, circuit 6 includes a reference diode or avalanche diode Z, the cathode of which is connected to the midpoint of a resistor bridge R2, R3. The values of resistors R2, R3 are chosen so that diode Z starts an avalanche when voltage Vac reaches the level at which the supply of load 1 is desired to be interrupted. Between the cathode gate of the GTO thyristor and terminal 3 is connected a switch 7, for example a thyristor, which turns on when diode Z becomes conductive, after which switch 5 turns off (time t2) and the current through the load abruptly drops to zero, as illustrated in FIG. 2 in dotted lines. Then, the current remains at zero until the beginning of the next positive halfwave where this sequence is repeated.

As mentioned previously, the abrupt variation of the current on the supply line at times t2 can cause electromagnetic disturbances.

To solve this problem, a low-pass filter 8 is conventional provided between each of terminals 2, 3, and circuit 4. Filter 8 includes, for example, inductors L1 and L2 and a capacitor C. A first end of each of inductors L1, L2 is connected to one of the respective terminals 2, 3. The second ends of inductors L1 and L2 are interconnected by capacitor C and are respectively connected to the terminals of the series circuit including the GTO thyristor and load 1. For a 1-A switched current, the values of inductors L1, L2 typically are on the order of 150 μH, and the capacitance of capacitor C typically is 470 nF. A disadvantage of this type of conventional solution is that such a filter 8 is bulky, non-integrable and expensive.

SUMMARY OF THE INVENTION

The present invention aims at providing a novel switching circuit which can be used without any filter.

The present invention also aims at providing such a switching circuit which is essentially realizable in the form of a monolithic component.

To achieve these and other objects, the present invention provides a switching circuit of the type including a gate turn-off thyristor biased to be normally on, further including, between the gate and a supply line, a capacitor and a controllable switch connected in parallel.

According to an embodiment of the present invention, the controllable switch is a bipolar transistor.

According to an embodiment of the present invention, the anode and cathode gates of the thyristor are interconnected via a resistor.

According to an embodiment of the present invention, a control terminal of the switch is connected to the anode of a reference diode, the cathode of which is connected to the midpoint of a resistor bridge.

The present invention also provides a bidirectional switching circuit formed of the antiparallel association of two switching circuits according to any of the preceding embodiments.

The present invention also provides a switching circuit made in monolithic form in a semiconductor substrate of a first conductivity type including first and second areas defined by first and second insulating walls, the first area including the thyristor made in lateral form, its cathode gate being connected to the first wall, and including the resistor bridge; the second area including the switch and the diode, the switch being a vertically-formed bipolar transistor; and the rear surface of the first area being coated with an insulating layer which lets free at least a portion of the rear surface of the first wall, a metallization covering the entire rear surface and ensuring with the first insulating wall a connection between the thyristor cathode gate and the transistor collector.

According to an embodiment of the present invention, the switching circuit made in monolithic form includes on the N-type upper surface side of the substrate:

in the first area:
  a first heavily-doped P-type anode region covered with a first metallization;
  a second heavily-doped N-type cathode region covered with a second metallization;
  a third heavily-doped N-type region, coated with a third metallization and in contact with the substrate, corresponding to the anode gate;
  a fourth heavily-doped P-type cathode gate region, in contact with the first insulating wall;
  a fifth heavily-doped P-type region, in short-circuit, through the third metallization, with the third region, and in contact with a sixth lightly-doped P-type region, the sixth region further being in contact with the fourth region and forming a resistor between the anode and cathode gates;
  lightly-doped P-type regions, the ends of which form one piece with heavily-doped P-type regions coated with respective metallizations, one of the metallizations short-circuiting a P-type region, corresponding to one of the resistors of the resistor bridge, and a heavily-doped N-type region; and in the second region:
  a lightly-doped P-type well, forming the base of the transistor, in which are formed heavily-doped N-type regions, covered with respective metallizations, corresponding to the emitter of the transistor and to the cathode of the diode; and on the rear surface side of the substrate, a heavily-doped N-type region forming the collector of the transistor.

According to an embodiment of the present invention, the second area includes on the upper surface side a heavily-doped N-type channel stop ring at the periphery of the well, the ring being covered with a metallization.

The present invention also provides a switching circuit made in monolithic form in a semiconductor substrate of a first conductivity type including first and second areas defined by insulating walls; the first area including the thyristor made in lateral form and the resistor bridge; the second area including the switch and the diode, the switch being a laterally-formed bipolar transistor; the connection between the thyristor cathode gate and the transistor collector being made on the front surface side.

According to an embodiment of the present invention, switching circuit made in monolithic form includes on the N-type upper surface side of the substrate:

in the first area:
a first heavily-doped P-type anode region covered with a first metallization;
a second heavily-doped N-type cathode region covered with a second metallization;
a third heavily-doped N-type region, coated with a third metallization and in contact with the substrate, corresponding to the anode gate;
a fourth heavily-doped P-type cathode gate region, separated from the first insulating wall;
a channel stop region between the fourth region and the first wall;
a fifth heavily-doped P-type region, in short-circuit, through the third metallization, with the third region, and in contact with a sixth lightly-doped P-type region, the sixth region further being in contact with the fourth region and forming a resistor between the anode and cathode gates;
lightly-doped P-type regions, the ends of which form one piece with heavily-doped P-type regions coated with respective metallizations, one of the metallizations short-circuiting a P-type region, corresponding to one of the resistors of the resistor bridge, and a heavily-doped N-type region; and in the second region:
a lightly-doped P-type well, forming the base of the transistor, in which are formed heavilydoped N-type regions, covered with respective metallizations, corresponding to the emitter of the transistor and to the cathode of the diode; and
at the well periphery, a heavily-doped N-type ring covered with a metallization, forming the transistor collector.

The foregoing objects, features and advantages of the present invention, will be discussed in detail in the following non-limiting description of specific embodiments in connection with the accompanying drawings.

DETAILED DESCRIPTION

For clarity, the same elements have been designated by the same references in the different drawings. Similarly, as usual in the representation of integrated circuits, the different cross-sectional views are not to scale.

The present invention provides control of the decrease of the current at the turning-off of a normally-on switch.

Figure 3:
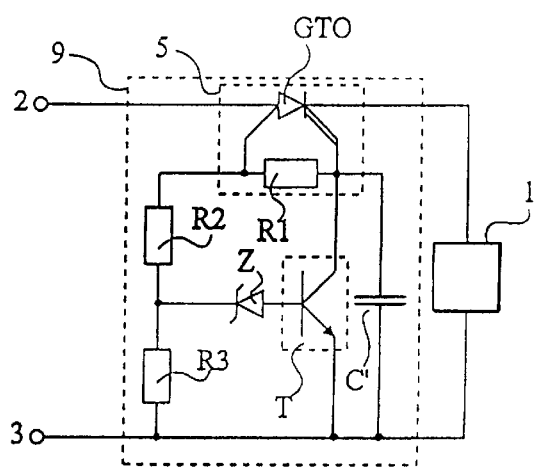
FIG. 3 shows an embodiment of a switching circuit according to the present invention.

FIG. 3 illustrates an embodiment of the present invention. It is attempted to limit across a load 1 the power provided by a supply voltage source Vac, for example the 220-volt mains voltage, provided between terminals 2 and 3. For this purpose, a switching circuit 9 according to the present invention is used.

Figure 1:
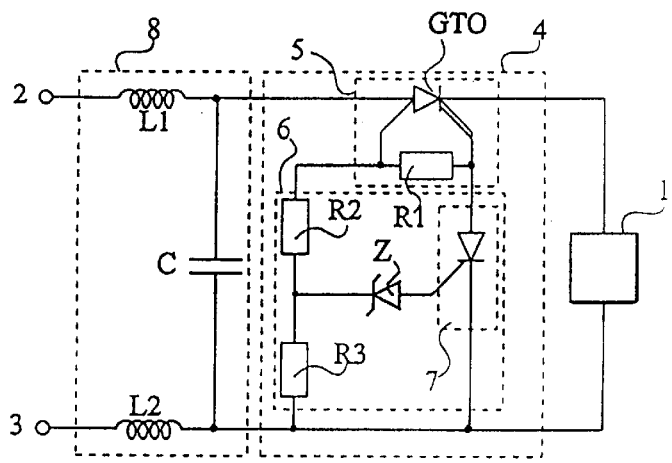
FIG. 1 shows an embodiment of a switching circuit according to prior art.

Circuit 9 includes, like circuit 4 of FIG. 1, a switch 5, a resistor R1, a reference diode Z, and a resistor bridge R2, R3 assembled like the elements of same references in FIG. 1.

According to the present invention, thyristor 7 is replaced with a bipolar transistor T and circuit 9 further includes, in parallel with transistor T, a capacitor C'. The operation of the switching circuit according to the present invention will appear more clearly hereafter. The values of the different components are, for example, for a 1-A switched current in a 50-Ωload, a diode Z with a 10-V threshold, a 90-kΩ resistor R2, a 240-kΩ resistor R3, and a capacitor C' with a 22-nF capacitance.

Figure 2:
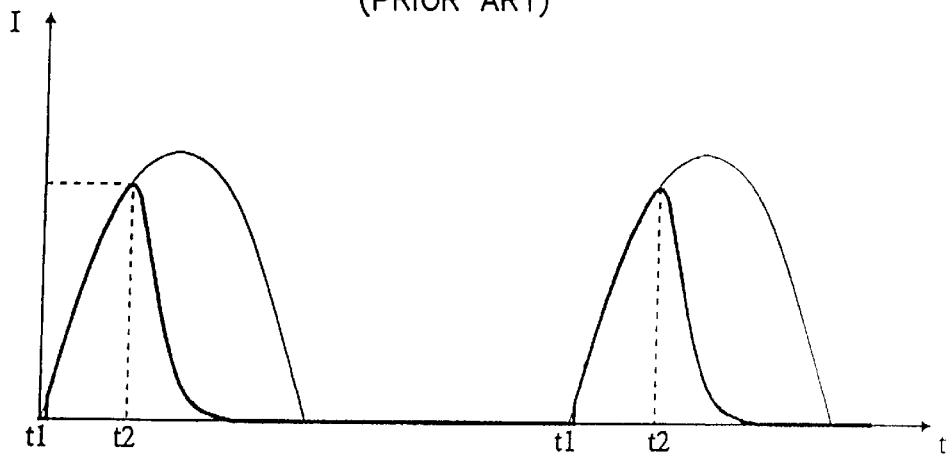
FIG. 2 illustrates the line current variations in the case of the circuit of FIG. 1 and in the case of a switching circuit according to the present invention.

As illustrated in FIG. 2, at the beginning of a positive halfwave of voltage Vac, switch 5 turns on in the same way as in circuit 4 of FIG. 1. Line current I is identical in this first phase to that of the conventional circuit.

Once switch 5 is on, capacitor C' charges. The voltage thereacross thus substantially follows the supply voltage.

As previously, when voltage Vac reaches a predetermined level, avalanche diode Z turns on and a current appears on the base of transistor T. However, as illustrated in full line in FIG. 2, capacitor C' according to the present invention discharges through the collector of transistor T. As long as transistor T has not saturated, this discharge is sinusoidal. Indeed, the collector current of transistor T follows its base current which is a function of the (sinusoidal) mains voltage. Once transistor T has saturated, the discharge occurs exponentially until the capacitor is completely discharged. Then, the current becomes zero and switch 5 is completely off. Transistor T remains saturated until the end of the positive halfwave, which maintains switch 5 off.

An advantage of the present invention thus is that the turning-off of switch 5 is progressive and goes along with a relatively slow variation of the line current, as illustrated in FIG. 2, thus limiting to a great extent electromagnetic disturbances on neighboring equipment.

Figure 4:
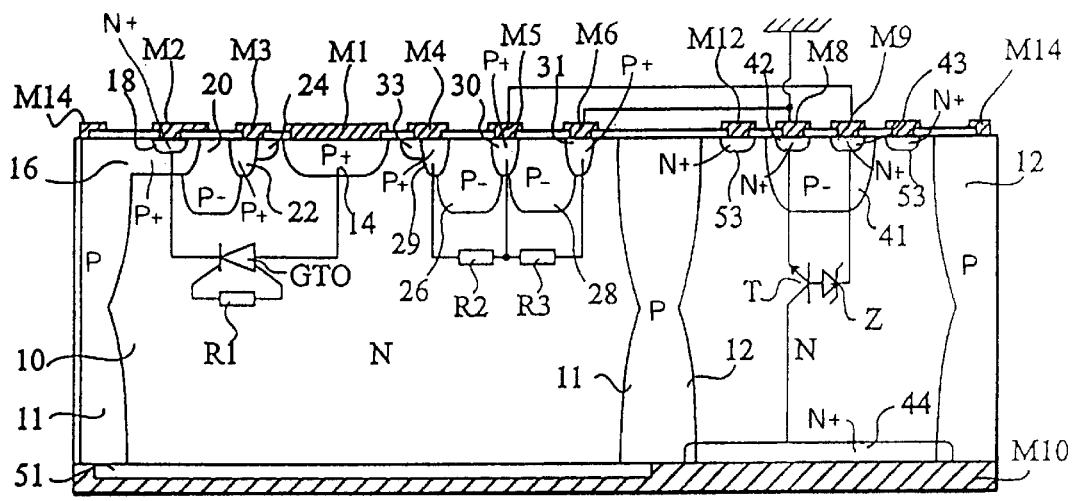
FIG. 4 is a simplified cross-sectional view showing a first example of monolithic realization of a circuit according to the present invention.

FIG. 4 is a simplified cross-sectional view showing a first example of embodiment in monolithic form of the circuit of FIG. 3.

Switching circuit 9 is made monolithically, except for capacitor C', in a semiconductor substrate 10, for example, silicon, of a first conductivity type, for example, N.

A first area surrounded with an insulating wall 11 and a second area surrounded with an insulating wall 12 are defined in this substrate. In the embodiment shown, these areas are adjacent and a portion of insulating wall 11 is thus combined with a portion of insulating wall 12. Conventionally, this insulating wall is made by drive-in of a P dopant from both surfaces of the substrate.

In the first area are formed, on the upper surface side, a first $P^+$-type region 14, a second $P^+$-type region 16, and an $N^+$-type region 18 inside region 16. These regions altogether form a lateral thyristor in which region 14 corresponds to the anode, substrate 10 to the anode gate, region 16 to the cathode gate, and region 18 to the cathode. Conventionally, for the thyristor to be able to be easily turned off by its gate, the cathode will have a small width and a great length. To make this thyristor normally on and form the equivalent of resistor RI shown in FIG. 3, a lightly-doped P-type region 20, a second contact of which is formed by another $P^+$-type region 22, itself in short-circuit with an $N^+$-type region 24 formed in substrate 10, is further formed in contact with $P^+$ region 18.

In the first area, lightly-doped P-type regions 26 and 28, for example in strips, meant to form resistors R2 and R3, are also formed on the upper surface side. The ends of these strips form one piece with heavily-doped P-type regions 29, 30, and 31. Resistor R2 is for example formed between regions 29 and 30 and resistor R3 is formed between regions 30 and 31.

To make the various contacts mentioned in FIG. 3, anode region 14 is coated with a metallization M1 and cathode region 18 is coated with a metallization M2. A metallization M3 establishes the short-circuit between P region 22 and N region 24. The connection between the anode gate of the GTO thyristor and a terminal of resistor R2 is made by a metallization M4 which connects P-type region 29 to a heavily-doped N-type area 33 formed in the substrate which, as seen previously, corresponds to the anode gate of the lateral GTO thyristor. The midpoint of resistors R2 and R3 is connected to a metallization M5 and the second terminal of resistor R3 is connected to a metallization M6.

In the second area, on the right-hand side of FIG. 4, are formed NPN transistor T and avalanche diode Z. A P-type well 41 in which are formed N-type regions 42 and 43 has been formed on the upper surface side. On the rear surface side is formed a heavily-doped N-type region 44. NPN transistor T is thus obtained, its emitter corresponding to region 42, its base to region 41, and its collector to substrate 10 and to N-type region 44. Diode Z corresponds to the junction between N region 43 and P well 41. A metallization M8 formed on region 42 corresponds to the emitter of the transistor and a metallization M9 formed on region 43 corresponds to the cathode of diode Z. Metallization M8 is connected to previously-described metallization M6 and to the ground while metallization M9 is connected to previously-described metallization M5. In practice, as known by those skilled in the art, metallizations M6 and M8 will preferably form a single metallization, as well as metallizations M5 and M9.

To ensure the connection between the cathode gate (region 16) of the GTO thyristor and the collector (region 44) of transistor T, insulating wall 11 is used. Insulating wall 11 is connected to region 16. In the embodiment shown, this connection is made by a continuity between the insulating wall and region 16. Disjoint regions connected by a metallization could also be provided. Further, on the rear surface side of the substrate, an insulating layer 51 is deposited facing the first area. This insulating layer lets free at least a portion of the rear surface of wall 11. A metallization M10 covers the entire rear surface and thus ensures the previously-mentioned connection.

As indicated previously, the monolithic realization described hereabove does not include capacitor C'. This capacitor may be connected by a first terminal to the ground terminal connected to metallization M8 and by the second terminal to rear surface metallization M10. A metallization M14 formed on the upper surface side of the substrate on the insulating walls, to which the second terminal of the capacitor will be connected, may also be provided. In this case, metallization M10 only has the function of ensuring the connection between the cathode gate of the GTO thyristor and the collector of transistor T, and is not meant to be connected to an external terminal. It will only be used to assemble the component as is the case for many power components to be connected to a radiator.

The embodiment of FIG. 4 is likely to have various alterations, modifications, and improvements which will readily occur to those skilled in the art, who can conventionally modify the various elements to improve their functions or give them additional functions. Further, the structure shown in FIG. 4 can form an entire monolithic component or form a portion of a larger monolithic component, other elements of which would extend into substrate 10 outside the shown portions defined by insulating walls 11 and 12. As an example of a possible alternative of the present invention, the formation of a heavily-doped N-type ring from the upper surface of the substrate having a channel stop function has been shown in FIG. 4. This ring is designated by reference 53 and may be coated with a metallization M12.

Figure 5:
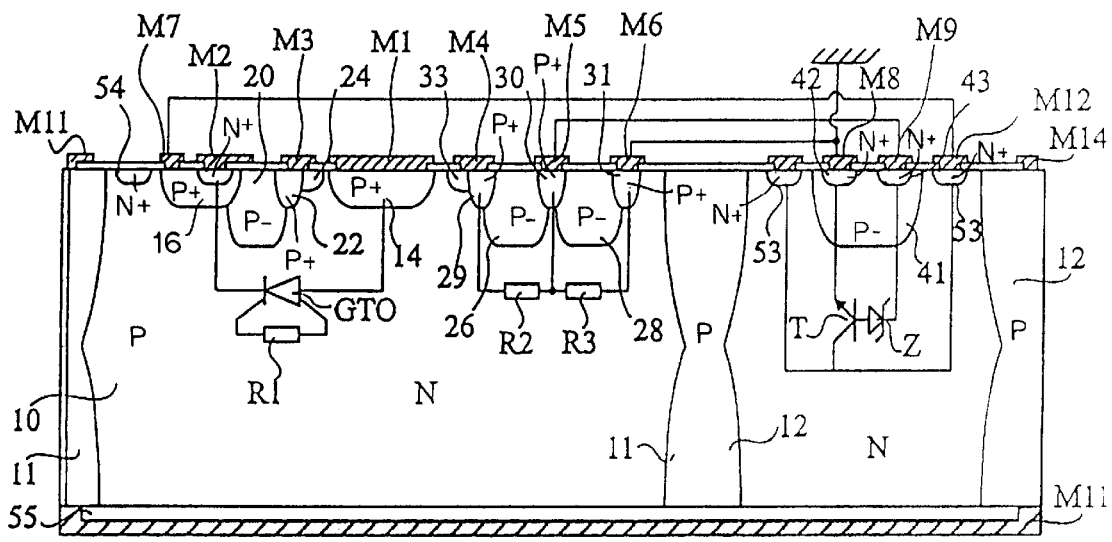
FIG. 5 is a simplified cross-sectional view showing a second example of monolithic realization of a circuit according to the present invention.

FIG. 5 illustrates a second example of embodiment in monolithic form of the circuit of FIG. 3.

On the left-hand side, resistor bridge R2, R3, resistor R1 and the GTO thyristor are formed as described previously in relation with FIG. 4. However, region 16 forming the cathode gate of the GTO thyristor now is separate from insulating wall 11. An N+ channel stop region 54 can then be provided between region 16 and wall 11. A metallization M7 is then formed above region 16.

On the right-hand side of FIG. 5, NPN-type bipolar transistor T is formed laterally. Its base and its emitter, as well as diode Z, are formed in the way previously described in relation with FIG. 4. The collector of transistor T now corresponds to the $N^+$ ring 53 formed at the periphery of base well 41. A collector metallization M12 is then provided on this ring 53.

The various connections are performed in the way previously described in relation with FIG. 4. However, the connection between the cathode gate of the GTO thyristor (region 16) and the collector is now ensured by a connection of metallizations M7 and M12.

Further, on the rear surface side of substrate 10, an insulating layer 55 is deposited. A metallization M11 covers the entire rear surface except, possibly, the rear surface of the insulating walls, and is used for the component assembly, as is the case for many power components meant to be connected to a radiator.

As indicated previously, the above-described monolithic realization does not include capacitor C'. Said capacitor will be connected between the ground terminal connected to metallization M8 and metallization M12.

An advantage of this second embodiment is that it provides total insulation of the two areas formed in the substrate, which prevents additional parasitic junctions from appearing.

An advantage of the present invention is that the switching circuit (9, FIG. 3) is integrable, if not capacitor C' (FIG. 3). However, capacitor C' has a relatively limited bulk.

Indeed, while the conventionally used filter (8, FIG. 1) required the very bulky assembly of two inductive resistors (L1, L2) and a capacitor (C), the circuit according to the present invention only uses a single capacitor (C', FIG. 3), the capacitance of which is much smaller than that of the capacitor of a conventional filter.

Indeed, capacitor C is a filtering component, the value of which is calculated according to inductances L1 and L2, but also according to the desired insertion (or frequency attenuation) slope. Conversely, capacitor C' is not a filtering component but is used as a voltage generator controlled by transistor T.

The one-way circuit according to the present invention described previously in relation with FIGS. 2 to 6 can be advantageously used to make a bidirectional switch adapted to switching a circuit connected to the mains in a way compatible with present standards relative to electromagnetic disturbances. For this purpose, two one-way switches according to the present invention will be used, connected in antiparallel between two supply terminals of a load, in a way which will readily occur to those skilled in the art.

Of course, the present invention is likely to have various alterations, modifications, and improvements which will readily occur to those skilled in the art. In particular, resistor R2 can be an adjustable resistor, to enable dimming applications or to adapt the turn-off threshold of the GTO thyristor. Further, the switch shown as an example in the form of a bipolar transistor (T) may be any one of various linear switches controllable to be turned on known in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A one-way switching circuit of the type including a gate turn-off thyristor biased to be normally on, further including, between the gate and a supply line, a capacitor and a controllable switch connected in parallel.

2. The circuit of claim 1, wherein the controllable switch is a bipolar transistor.

3. The circuit of claim 1, wherein said gate turn-off thyristor comprises an anode gate and a cathode gate, and wherein the anode and cathode gates of the thyristor are interconnected via a resistor.

4. A one-way switching circuit of the type including a gate turn-off thyristor biased to be normally on, further including, between the gate and a supply line, a capacitor and a controllable switch connected in parallel, wherein a control terminal of the switch is connected to an anode of a reference diode, a cathode of which is connected to the midpoint of a resistor bridge.

5. A bidirectional switching circuit, formed of the antiparallel association of two switching circuits, each said circuit being a one-way switching circuit of the type including a gate turn-off thyristor biased to be normally on, further including, between the gate and a supply line, a capacitor and a controllable switch connected in parallel.

6. The circuit of claim 4 made in monolithic form in a semiconductor substrate of a first conductivity type, including first and second areas defined by first and second insulating walls:
the first area including the thyristor made in lateral form, its cathode gate being connected to the first wall, and including the resistor bridge;
the second area including the switch and the diode, the switch being a vertically-formed bipolar transistor; and
a rear surface of the first area being coated with an insulating layer which lets free at least a portion of the rear surface of the first wall, a metallization covering the entire rear surface and ensuring with the first insulating wall a connection between the thyristor cathode gate and the transistor collector.

7. The circuit of claim 6, including, on the N-type upper surface side of the substrate:
in the first area:
a first heavily-doped P-type anode region covered with a first metallization;
a second heavily-doped N-type cathode region covered with a second metallization;
a third heavily-doped N-type region, coated with a third metallization and in contact with the substrate, corresponding to the anode gate;
a fourth heavily-doped P-type cathode gate region, in contact with the first insulating wall;
a fifth heavily-doped P-type region, in short-circuit, through the third metallization, with the third region, and in contact with a sixth lightly-doped P-type region, the sixth region further being in contact with the fourth region and forming a resistor between the anode and cathode gates;
lightly-doped P-type regions, the ends of which form one piece with heavily-doped P-type regions coated with respective metallizations, one of the metallizations short-circuiting a P-type region, corresponding to one of the resistors of the resistor bridge, and a heavily-doped N-type region; and
in the second region:
a lightly-doped P-type well, forming the base of the transistor, in which are formed heavily-doped N-type regions, covered with respective metallizations, corresponding to the emitter of the transistor and to the cathode of the diode; and
on the rear surface side of the substrate, a heavily-doped N-type region forming the collector of the transistor.

8. The circuit of claim 7, wherein the second area includes on the upper surface side a heavily-doped N-type channel stop ring at the periphery of the well, the ring being covered with a metallization.

9. The circuit of claim 4 made in monolithic form in a semiconductor substrate of a first conductivity type, including first and second areas defined by insulating walls;
the first area including the thyristor made in lateral form and the resistor bridge;
the second area including the switch and the diode, the switch being a laterally-formed bipolar transistor;
the connection between the thyristor cathode gate and the transistor collector being made on the front surface side.

10. The circuit of claim 9, including on the N-type upper surface side of the substrate:
in the first area:
a first heavily-doped P-type anode region covered with a first metallization;
a second heavily-doped N-type cathode region covered with a second metallization;
a third heavily-doped N-type region, coated with a third metallization and in contact with the substrate, corresponding to the anode gate;
a fourth heavily-doped P-type cathode gate region, separated from the first insulating wall;

a channel stop region between the fourth region and the first wall;

a fifth heavily-doped P-type region, in short-circuit, through the third metallization, with the third region, and in contact with a sixth lightly-doped P-type region, the sixth region further being in contact with the fourth region and forming a resistor between the anode and cathode gates;

lightly-doped P-type regions, the ends of which form one piece with heavily-doped P-type regions coated with respective metallizations, one of the metallizations short-circuiting a P-type region, corresponding to one of the resistors of the resistor bridge, and a heavily-doped N-type region; and in the second region:
   a lightly-doped P-type well, forming the base of the transistor, in which are formed heavily-doped N-type regions, covered with respective metallizations, corresponding to the emitter of the transistor and to the cathode of the diode; and
   at the well periphery, a heavily-doped N-type ring covered with a metallization, forming the transistor collector.

11. A one-way switching circuit comprising:
a gate turn-off thyristor normally biased to its conductive state and having at least a cathode gate and an anode gate;
a supply line that couples said gate turn-off thyristor to a load;
a capacitor;
a controllable switch having main terminals;
said capacitor and the main terminals of said controllable switch being connected in parallel between one of said gate turn-off thyristor gates and said supply line; and
a resistor coupled between the anode gate and cathode gate of said gate turn-off thyristor.

12. The circuit of claim 11, wherein the controllable switch is a bipolar transistor.

13. The circuit of claim 11 further including a reference diode coupled to a control terminal of the controllable switch.

14. The circuit of claim 13 further including a resistor bridge having its midpoint coupled to the cathode of the reference diode with the anode of the reference diode connected to the control terminal of the controllable switch.

15. A one-way switching circuit comprising:
a gate turn-off thyristor normally biased to its conductive state and having at least a cathode gate and an anode gate;
a supply line that couples said gate turn-off thyristor to a load;
a capacitor;
a controllable switch having main terminals;
means for coupling said capacitor means and the main terminals of said controllable switch means in parallel between one of said gate turn-off thyristor gates and said supply line; and
a resistor coupled between the anode gate and cathode gate of said gate turn-off thyristor.

16. The circuit of claim 15, wherein said controllable switch means is a bipolar transistor means.

17. The circuit of claim 15, wherein said capacitor means and said controllable switch means are connected to the cathode gate of the gate turn-off thyristor.

18. The circuit of claim 17 further including a reference diode and a resistor bridge with the control terminal of the controllable switch means being connected to an anode of the reference diode, a cathode of the reference diode being connected to the mid-point of the resistor bridge.

19. A one-way switching circuit of the type including a gate turn-off thyristor biased to be normally on, further including, between the gate and a supply line, a capacitor and a controllable switch connected in parallel, wherein a control terminal of the switch is connected to a reference diode, wherein the circuit is constructed in monolithic form in a semiconductor substrate of a first conductivity type, including first and second areas defined by first and second insulating walls, the first area including the thyristor made in lateral form, its cathode gate being connected to the first wall, the second area including the switch and the diode, the switch being a vertically-formed bipolar transistor.

20. The circuit of claim 19, wherein a rear surface of the first area is being coated with an insulating layer which lets free at least a portion of the rear surface of the first wall, a metallization covering the entire rear surface and insuring the first insulating wall, a connection between the thyristor cathode gate and the transistor collector.

21. The circuit of claim 20, including, on the N-type upper surface side of the substrate:
in the first area:
   a first heavily-doped P-type anode region covered with a first metallization;
   a second heavily-doped N-type cathode region covered with a second metallization;
   a third heavily-doped N-type region, coated with a third metallization and in contact with the substrate, corresponding to the anode gate;
   a fourth heavily-doped P-type cathode gate region, in contact with the first insulating wall;
   a fifth heavily-doped P-type region, in short-circuit, through the third metallization, with the third region, and in contact with a sixth lightly-doped P-type region, the sixth region further being in contact with the fourth region and forming a resistor between the anode and cathode gates;
lightly-doped P-type regions, the ends of which form one piece with heavily-doped P-type regions coated with respective metallizations, one of the metallizations short-circuiting a P-type region, corresponding to one of the resistors of the resistor bridge, and a heavily-doped N-type region; and
in the second region:
   a lightly-doped P-type well, forming the base of the transistor, in which are formed heavily-doped N-type regions, covered with respective metallizations, corresponding to the emitter of the transistor and to the cathode of the diode; and
   on the rear surface side of the substrate, a heavily-doped N-type region forming the collector of the transistor.

22. A one-way switching circuit of the type including a gate turn-off thyristor biased to be normally on, further including, between the gate and a supply line, a capacitor and a controllable switch connected in parallel, wherein a control terminal of the switch is connected to a reference diode, wherein the circuit is constructed in monolithic form in a semiconductor substrate of a first conductivity type, including first and second areas defined by insulating walls, the first area including the thyristor made in lateral form, the second area including the switch and the diode, the switch being a laterally-formed bipolar transistor, the connection between the thyristor cathode gate and the transistor collector being made on the front surface side.

23. The circuit of claim 22, wherein the first area also includes a resistor bridge with the cathode of the reference diode connected to the midpoint of the resistor bridge.

24. The circuit of claim 23, including on the N-type upper surface side of the substrate:

in the first area:
- a first heavily-doped P-type anode region covered with a first metallization;
- a second heavily-doped N-type cathode region covered with a second metallization;
- a third heavily-doped N-type region, coated with a third metallization and in contact with the substrate, corresponding to the anode gate;
- a fourth heavily-doped P-type cathode gate region, separated from the first insulating wall;
- a channel stop region between the fourth region and the first wall;
- a fifth heavily-doped P-type region, in short-circuit, through the third metallization, with the third region, and in contact with a sixth lightly-doped P-type region, the sixth region further being in contact with the fourth region and forming a resistor between the anode and cathode gates;
- lightly-doped P-type regions, the ends of which form one piece with heavily-doped P-type regions coated with respective metallizations, one of the metallizations short-circuiting a P-type region, corresponding to one of the resistors of the resistor bridge, and a heavily-doped N-type region; and in the second region:
- a lightly-doped P-type well, forming the base of the transistor, in which are formed heavily-doped N-type regions, covered with respective metallizations, corresponding to the emitter of the transistor and to the cathode of the diode; and
- at the well periphery, a heavily-doped N-type ring covered with a metallization, forming the transistor collector.

25. A method of constructing a one way switching circuit of the type including a gate turn-off thyristor biased to be normally on, said circuit further including, between the gate and a supply line, a capacitor and a controllable switch connected in parallel, said method comprising the steps of:

connecting a control terminal of the switch to a reference diode;

constructing in monolithic form a semiconductor substrate of a first conductivity type, including first and second areas defined by first and second insulating walls;

forming the first area including the thyristor made in lateral form, its cathode gate being connected to the first wall; and forming the second area including the switch and the diode, the switch being a vertically formed bipolar transistor.

26. The method of claim 25, further comprising coating a rear surface of the first area with an insulating layer which lets free at least a portion of the rear surface of the first wall, a metallization covering the entire rear surface and ensuring with the first insulating wall a connection between the thyristor cathode gate and the transistor collector.

* * * * *